United States Patent [19]

Bauman

[11] 4,389,618

[45] Jun. 21, 1983

[54] ADAPTIVE FEED-FORWARD SYSTEM

[75] Inventor: Ronald M. Bauman, Washington, D.C.

[73] Assignee: The United States of America as represented by the Secretary of the Navy, Washington, D.C.

[21] Appl. No.: 254,353

[22] Filed: Apr. 15, 1981

[51] Int. Cl.³ .............................................. H03F 1/26
[52] U.S. Cl. .................................... 330/149; 330/151
[58] Field of Search ................................ 330/149, 151

[56] References Cited

U.S. PATENT DOCUMENTS 4,130,807 12/1978 Hall et al. ...................... 330/151 X Primary Examiner—James B. Mullins
Attorney, Agent, or Firm—Robert F. Beers; William T. Ellis; Alan P. Klein

[57] ABSTRACT

A feed-forward system for reducing the distortion products from a device such as an amplifier, wherein a sample of the device input signal is subtractively combined with a sample of the device output signal to produce a sample of the distortion products. The distortion sample is adjusted in amplitude and phase and subtractively combined with the device output to produce a distortion-reduced system output. A synchronous detector correlates a sample of the system output, in which the proportion of distortion has been increased, with another sample of the distortion products to produce control signals for a modulator which adaptively adjusts the amplitude and phase of the distortion sample subtractively combined with the device output.

10 Claims, 2 Drawing Figures

ADAPTIVE FEED-FORWARD SYSTEM

BACKGROUND OF THE INVENTION

This invention relates generally to feed-forward systems used to reduce distortion products in electrical devices such as amplifiers, and more particularly to such systems which are capable of adapting to maintain the cancellation in the face of instabilities.

The term "distortion" as used herein shall be understood to include any signals present in the output of the electrical device which were not present in the input such as hum, noise, harmonic distortion, intermodulation distortion, etc.

In the conventional adaptive feed-forward cancelling system, samples of the input and output signals of a device such as a non-linear amplifier are adjusted in amplitude and phase and subtractively combined in a first combiner to produce a sample of the distortion products present in the output from the device. This distortion sample is adjusted in amplitude and phase and fed forward to a second combiner where it is subtractively combined with the output from the device to cancel the remaining distortion products therein. Typically, the distortion sample is adjusted in amplitude and phase by passing it through an amplitude-and-phase modulator followed by a subsidiary amplifier. Uncontrolled component variations such as drift can necessitate changes in the amplitude and phase settings of the modulator. To maintain the cancellation, a control means such as a synchronous detector correlates a sample of the feed-forward system output with the distortion sample and adaptively adjusts the modulator to minimize the correlation result. If D denotes the power level of the distortion component and S denotes the power level of the fundamental component (input signal replica) in the output signal from the device, and if the first combiner rejects the fundamental component relative to the distortion component by a power ratio $R_1$, the second combiner rejects the distortion component relative to the fundamental component by a power ratio of $$R_2 = D^2 R_1 / S^2.$$

The performance of this conventional adaptive feed-forward system suffers from the following disadvantage. Since the sample of the distortion products is not entirely free of the fundamental component ($R_1$ is never infinite in practice), and since the sample of the feed-forward system output has a very large proportion $SR_2/D$ of fundamental component in it, when the two samples are correlated by the synchronous detector the correlation is inevitably influenced or dominated by the fundamental component rather than by the distortion component. This has the effect of causing the detector to adjust the modulator in a manner to minimize the correlation between the fundamental component in the system output and the fundamental component in the distortion sample, instead of minimizing the correlation between the distortion component in the system output and the distortion component in the distortion sample. Thus, minimization of the correlation will not generally achieve the desired effect of minimizing distortion in the feed-forward system output and can even result, in some instances, in an increase in distortion in the feed-forward system output.

Another problem is that the sample of the system output that is applied to the signal input of the synchronous detector contains the fundamental and distortion components in the ratio $SR_2/D$, which ratio may exceed the dynamic range of the detector. When the dynamic range of the detector is exceeded, accurate correlation cannot be achieved and, thus, cancellation of the distortion from the device is limited.

SUMMARY OF THE INVENTION

Accordingly, it is an object of the present invention to improve distortion cancellation in adaptive feed-forward systems.

Another object is to reduce the influence of the fundamental component in the output signal on the correlation process which maintains the distortion cancellation in adaptive feed-forward systems.

A further object is to reduce the dynamic range requirements for the control means that is used to maintain the distortion cancellation in adaptive feed-forward systems.

The objects of the present invention are achieved by an adaptive feed-forward system for reducing the distortion generated by a device such as an amplifier. The system includes a first sampling means which extracts a sample of the distortion products from the output of the device, and an adjustable equalizing means which equalizes the sample and the products remaining in the output of the device after extracting the sample. The equalized sample and the remaining products are subtractively combined in a combining means to produce a distortion-reduced system output. The distortion reduction is maintained by a control means which correlates a distortion-increased sample of the system output with the sample of the distortion products extracted from the output of the device by the first sampling means and adjusts the first equalizing means to minimize the correlation result. The distortion-increased sample of the system output is provided by a second sampling means which extracts the sample, and a proportion-changing means which reduces the fundamental component present in the sample by a factor $R_3$. The distortion component in the system output is reduced by the same factor compared to the distortion component in the output of prior art feed-forward systems.

One advantage of the invention is that the dynamic range requirement of the control means that maintains the distortion cancellation is reduced compared with prior art systems by the action of the proportion-changing means.

Another advantage is that the amount of cancellation obtainable with the invention can be greater, given components with limited dynamic range and imperfect amplitude and phase matching, than would otherwise be possible with conventional systems. Alternatively, for a given required amount of distortion cancellation, the invention can achieve that cancellation with a smaller power ratio $R_1$.

Additional advantages and features will become apparent as the subject invention becomes better understood by reference to the following detailed description when considered in connection with the accompanying drawings, wherein:

DESCRIPTION OF THE PREFERRED EMBODIMENT

Figure 1:
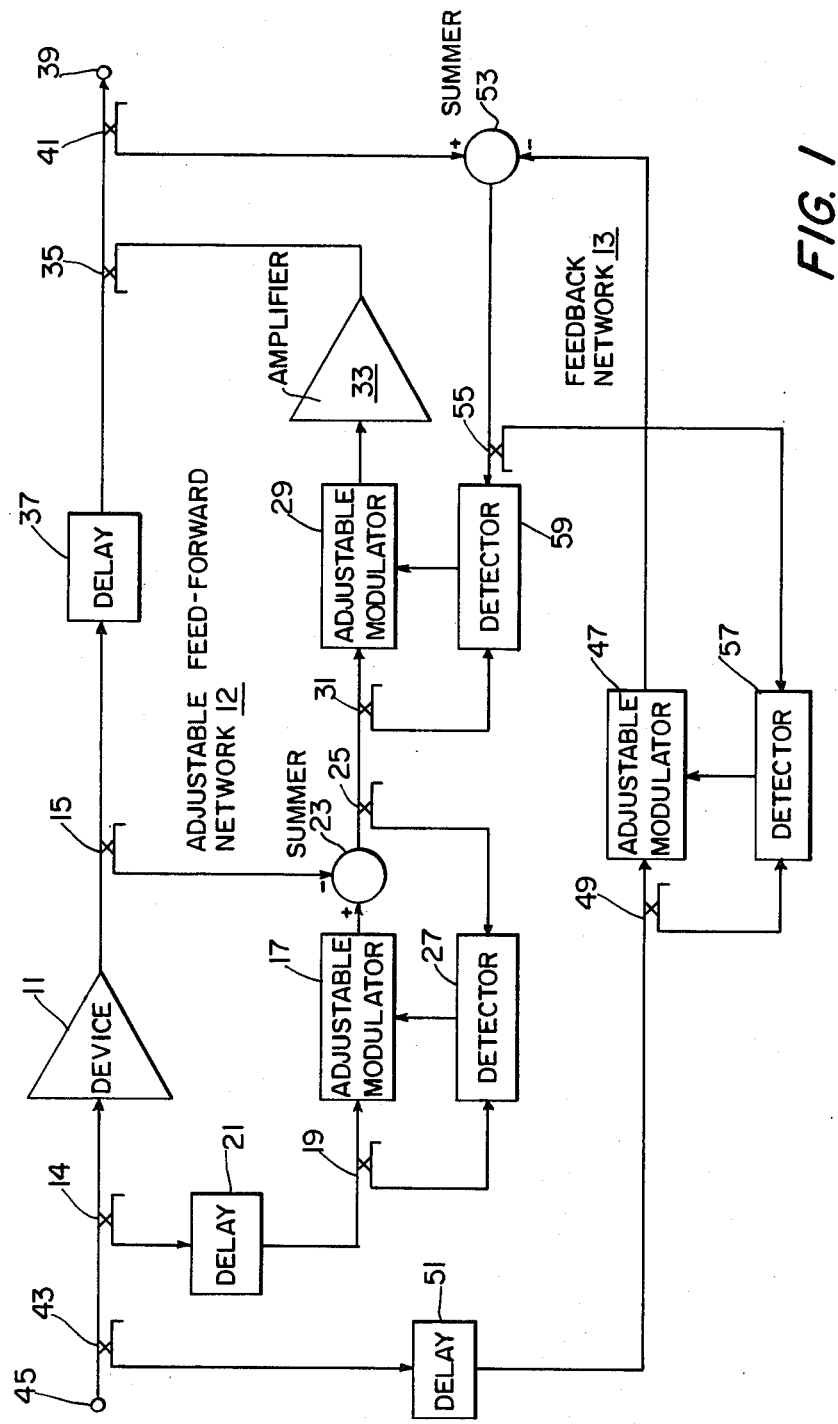
FIG. 1 is a block schematic diagram of a first embodiment of the adaptive feed-forward system according to the invention.

Referring now to the drawings wherein like characters refer to like or corresponding parts, FIG. 1 illustrates an adaptive feed-forward system for reducing the distortion generated by a device 11, such as an amplifier.

The adaptive feed-forward system includes an adjustable feed-forward network 12 for cancelling the distortion products generated by the device 11, and a feedback network 13 for adaptively adjusting the feed-forward network to compensate for uncontrolled component variations which can necessitate changes in the feed-forward network to maintain cancellation.

In preference to any other form of adjustable feed-forward network, the invention employs a feed-forward network 12 in the nature of a first sampling means which extracts a sample of the distortion products from the output of the device; an adjustable equalizing means which equalizes the sample and the products remaining in the output of the device after extracting the sample; and a combining means which subtractively combines the equalized samples and the remaining products to produce a distortion-reduced system output.

While the first sampling means may take a variety of forms, conveniently it may take the form illustrated in FIG. 1 of a coupler 14 connected in series with the input of the device 11; a coupler 15 connected in series with the output of the device; an adjustable amplitude-and-phase modulator 17 connected to the auxiliary output port of the coupler 14 by way of another coupler 19 and a time delay 21; a summer 23 whose inputs are connected respectively to the output of the amplitude-and-phase modulator 17 and to the auxiliary output port of the coupler 15; a coupler 25 connected in series with the output of the summer 23; and a synchronous detector 27 having a signal input connected to the auxiliary output port of the coupler 25, a reference input connected to the auxiliary output port of the coupler 19, and its output connected to the control input of the modulator 17.

The couplers shown in the drawing are directional couplers having a main input port, a main output port, an auxiliary port, and a terminated port which is terminated in a load equal to the characteristic impedance of the coupler. When the coupler is used as a signal sampler, a fraction of the power flowing from the main input port to the main output port is extracted from the auxiliary port in proportion to its coupling factor. When the coupler is used as a signal injector, power is applied to the auxiliary port to cancel power flowing from the main input port to the main output port. In both instances, power flowing from the main output port to the main input port also couples to the auxiliary port but is attenuated, usually significantly, by the directional characteristics of the coupler. Regardless of how the coupler is used, assuming it is lossless, the power entering the coupler equals the power leaving the coupler. The convention will be adopted herein of referring to the auxiliary port as the auxiliary output port when the coupler is used as a signal sampler, and as the auxiliary input port when the coupler is used as a signal injector.

Amplitude-and-phase modulators, and synchronous detectors are well known to those skilled in the art, suitable modulators and detectors being disclosed, for example, in Section 3 of Technical Report RADC-TR-77-270 (August 1977) to Rome Air Development Center, entitled "High Power Controller and ICS" publicly available from the National Technical Information Service.

While the adjustable equalizing means may take a variety of forms, conveniently it may take the form illustrated in FIG. 1 of an adjustable amplitude-and-phase modulator 29 whose input is connected to the main output port of the coupler 25 by way of another coupler 31, and a subsidiary amplifier 33 connected to the output of the modulator 29.

The combining means may comprise, for example, a coupler 35 whose main input port is connected to the main output port of the coupler 15 by way of a time delay 37, whose auxiliary input port is connected to the output of the subsidiary amplifier 33, and whose main output port is connected to the system output terminal 39.

In preference to any other form of feedback network, the invention employs a feedback network 13 in the nature of a second sampling means which extracts a sample of the system output; a proportion-changing means which increases the proportion of distortion in the extracted sample of the system output; and a control means which correlates the distortion-increased sample of the system output with the sample of the distortion products extracted from the output of the device by the first sampling means, and adjusts the equalizing means to minimize the correlation result.

The second sampling means may comprise, for example, a coupler 41 connected in series with the main output port of the coupler 35.

While the proportion-changing means may take a variety of forms, conveniently it may take the form illustrated in FIG. 1 of a coupler 43 connected between the device input terminal 45 and the coupler 14; an adjustable amplitude-and-phase modulator 47 whose input is connected to the auxiliary output port of the coupler 43 by way of another coupler 49 and a time delay 51; a summer 53 whose inputs are connected respectively to the output of the modulator 47 and to the auxiliary output port of the coupler 41; a coupler 55 connected in series with output of the summer 53; and a synchronous detector 57 having a signal input connected to the auxiliary output port of the coupler 55, a reference input connected to the auxiliary output port of the coupler 49, and its output connected to the control input of the modulator 47.

While the control means may take a variety of forms, conveniently it may take the form illustrated in FIG. 1 of a synchronous detector 59 having a signal input connected to the main output port of the coupler 55, a reference input connected to the auxiliary output port of the coupler 31, and its output connected to the control input of the modulator 29.

The time delay introduced by delay 37 is such that signals fed to the coupler 35 from the output of the device 11 by way of the path including coupler 15 and time delay 37 or by way of the path including coupler 15, summer 23, coupler 25, coupler 31, modulator 29, and subsidiary amplifier 33, each appear at the input ports of coupler 35 in time coincidence. The time delay introduced by delay 21 is such that signals fed to the summer 23 from input terminal 45 by way of the path including coupler 43, coupler 14, time delay 21 and modulator 17 or by way of the path including coupler 43, coupler 14, device 11, and coupler 15, each appear at the input terminals of summer 23 in time coincidence. The time delay introduced by delay 51 is such that signals fed to the summer 53 from input terminal 45 by way of the path including coupler 43, time delay 51, coupler 49, and modulator 47, or by way of the path including coupler 43, coupler 14, device 11, coupler 15, time delay 37, coupler 35 and coupler 41, each appear at the input terminals of summer 53 in time coincidence.

In operation of the system shown in FIG. 1, a sample of the device input signal is extracted by the coupler 14, and a sample of the device output signal is extracted by the coupler 15. The device output signal contains a fundamental component (replica of the input signal) at power level S, and a distortion component at power level D; that is to say, the device output contains a fundamental component and a distortion component in the ratio S/D. The sample of the device input signal is fed from the auxiliary output port of the coupler 14 by way of the delay 21 and the coupler 19 to the adjustable amplitude-and-phase modulator 17 which equalizes the sample of the device input signal and its replica in the sample of the device output. A portion of the sample of the device input signal is extracted by the coupler 19 and fed from its auxiliary output port to the reference input of the synchronous detector 27. The output of the modulator 17 and the output of the auxiliary output port of the coupler 15 are fed to the summer 23 which subtractively combines the equalized sample of the device input signal and the extracted sample of the device output signal to produce a distortion products sample. The summer 23 rejects the fundamental component in the sample of the device output signal relative to the distortion component by the power ratio $R_1$, so that the distortion products sample contains these components in the ratio $S/DR_1$.

A portion of the distortion products sample is extracted by the coupler 25 and fed from its auxiliary output port to the signal input of the synchronous detector 27. The detector 27 correlates the extracted portion of the distortion products sample with the sample of the device input signal and adjusts the modulator 17 to minimize the correlation. The distortion products sample is fed by way of the coupler 25 and the coupler 31 to the adjustable amplitude-and-phase modulator 29 and the subsidiary amplifier 33 which equalize the sample and the distortion products remaining in the output of the device after extracting the sample. A portion of the distortion products sample is extracted by the coupler 31 and fed from its auxiliary output port to the reference input of the synchronous detector 59. This sample at the reference input of the detector 59 contains the distortion and fundamental components in the ratio $DR_1/S$. The output of the subsidiary amplifier 33 is fed to the auxiliary input port of the coupler 35 and the output of the main port of the coupler 15 is fed by way of the delay 37 to the main input port of the coupler 35 which subtractively combines the equalized sample and the remaining products and feeds the result by way of the coupler 41 to the output terminal 39 as a distortion-reduced system output. The coupler 35 rejects the distortion component in the device output signal relative to the fundamental component by the power ratio $R_2$ so that the system output contains these components in the ratio $SR_2/D$.

A sample of the distortion-reduced system output is extracted by the coupler 41, and a sample of the device input signal is extracted by the coupler 43. The sample of the device input signal is fed from the auxiliary output port of the coupler 43 by way of the delay 51 and the coupler 49 to the adjustable amplitude-and-phase modulator 47 which equalizes the sample of the device input signal and its replica in the sample of the system output. A portion of the sample of the device input signal is extracted by the coupler 49 and fed from its auxiliary output port to the reference input of the synchronous detector 57. The output of the modulator 47 and the output of the auxiliary output port of the coupler 41 are fed to the summer 53 which subtractively combines the equalized sample and the sample of the system output to produce a distortion-increased sample. The summer 53 rejects the fundamental component in the system output relative to the distortion component by the power ratio $R_3$ so that the distortion-increased sample contains these components in the ratio $SR_2/DR_3$.

A portion of the distortion-increased sample is extracted by the coupler 55 and fed from its auxiliary output port to the signal input of the synchronous detector 57. The detector 57 correlates the extracted portion of the distortion-increased sample with the sample of the device input signal and adjusts the modulator 47 to minimize the correlation. The distortion-increased sample is fed by way of the coupler 55 to the signal input of the synchronous detector 59. The sample at the signal input of the detector 59 contains the fundamental and distortion components in the ratio $SR_2/DR_3$, which is down by a factor of $R_3$ from the ratio associated with the prior art adaptive feed-forward system. This has the two-fold advantage of reducing the influence of the fundamental component on the correlation process, and of reducing the dynamic range requirements for the detector. The synchronous detector 59 correlates the distortion-increased sample containing the fundamental and distortion components in the ratio $SR_2/DR_3$ with the extracted portion of the distortion products sample containing the fundamental and distortion components in the ratio $S/DR_1$ and adjusts the modulator 29 to minimize the correlation. Both the fundamental components and the distortion components contribute to the correlation, so that the detector 57 will adjust the modulator 29 to equalize these two correlation components. The equality of their magnitudes implies that the product of the fundamental components in the two detector inputs equals the product of the distortion components in the two detector inputs. This in turn implies that the ratio of the fundamental and distortion components in the distortion-increased sample times the ratio of the fundamental and distortion components in the distortion products sample equals unity, or $$(SR_2/DR_3)(S/DR_1)=1$$

from which it follows that the power ratio by which the distortion component in the device output signal is rejected relative to the fundamental component $$R_2=D^2R_1R_3/S^2.$$

The ratio $R_2$ is enhanced by a factor $R_3$ over the ratio associated with the prior art adaptive feed-forward system, so that the present invention provides a substantial improvement in distortion cancellation.

Figure 2:
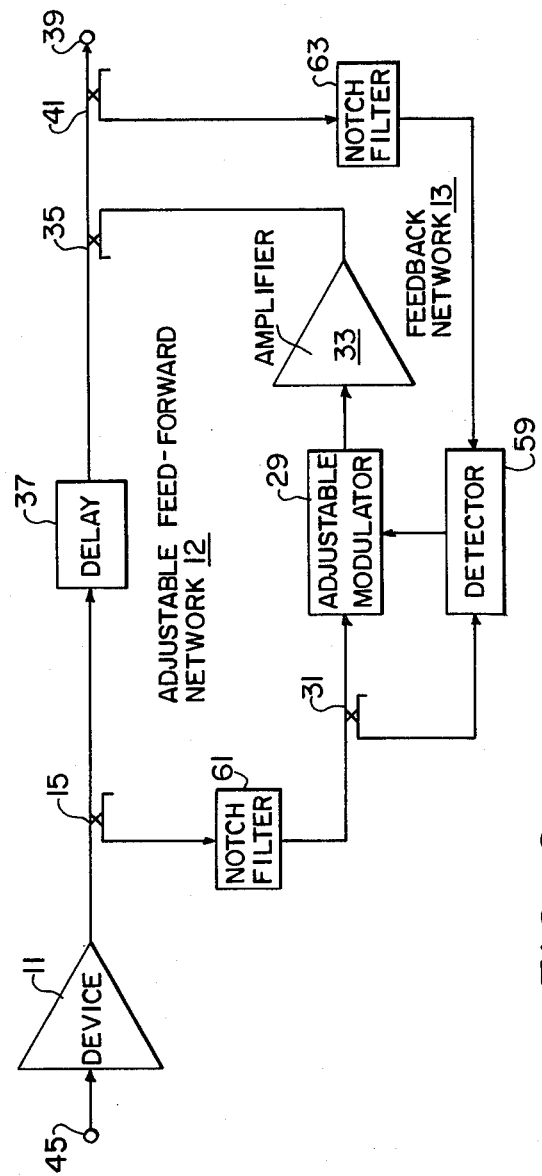
FIG. 2 is a block schematic diagram of a second embodiment of the adaptive feed-forward system according to the invention.

FIG. 2 illustrates a modification of the system shown in FIG. 1. The system of FIG. 2 differs from that of FIG. 1 in the substitution for all of the elements of the first sampling means except for the coupler 15, of a notch filter 61 having notches at the frequencies of the fundamental component of the device output signal. The notch filter 61 is connected between the auxiliary output port of the coupler 15 and the main input port of the coupler 31. The system of FIG. 2 further differs from that of FIG. 1 in the substitution for all of the elements of the proportion-changing means of a notch filter 63 having notches at the frequencies of the fundamental component in the system output signal. The notch filter 63 is connected between the auxiliary output port of the coupler 41 and the signal input of the synchronous detector 59. The notch filter 61 rejects the signal component in the sample of the device ouput signal relative to the distortion component by the power ratio $R_1$ so that the reference input to the detector 59 contains these components in the ratio $DR_1/S$. The notch filter 63 rejects the signal component in the system output by the power ratio $R_3$ so that the signal input to the detector 59 contains these components in the ratio $DR_3/SR_2$. The operation of the remainder of the system is the same as that of FIG. 1.

Obviously, numerous modifications and variations of the present invention are possible in light of the above teachings. For example, further distortion cancellation can be achieved by means of multiple feed-forward systems in which the combined adaptive feed-forward system and device of FIG. 1 or FIG. 2 is considered to be the device whose distortion is to be reduced. Thus, for example, the entire combination of FIG. 1 can be substituted for the device 11 in FIG. 1 or 2. It is therefore to be understood that within the scope of the claims, the invention may be practiced otherwise than as specifically described herein.

What is claimed as new and desired to be secured by Letters Patent of the United States is:

1. An adaptive feed-forward system for reducing the distortion generated by a device such as an amplifier, the feed-forward system comprising:
   first sampling means adapted to be connected to the device for extracting a sample of the distortion products from the output of the device;
   an adjustable equalizing means connected to the first sampling means for equalizing the sample and the products remaining in the output of the device after extracting the sample;
   combining means connected to the first equalizing means and adapted to be connected to the device for subtractively combining the equalized sample and the remaining products to produce a distortion reduced system output;
   second sampling means for extracting a sample of the system output;
   proportion-changing means connected to the second sampling means for increasing the proportion of distortion in the extracted sample of the system output; and
   control means connected to the first sampling means, to the proportion-changing means, and to the equalizing means for correlating the distortion-increased sample of the system output with the sample of the distortion products extracted from the output of the device by the first sampling means and adjusting the first equalizing means to minimize the correlation result.

2. The feed-forward system recited in claim 1 wherein the first sampling means includes:
   a first coupler for extracting a sample of the device input, the first coupler having a main output port adapted to be connected to the device input, and an auxiliary output port;
   a second coupler for extracting a sample of the device output, the second coupler having an input port adapted to be connected to the device output, and an auxiliary output port;
   a third coupler having an input port connected to the auxiliary output port of the first coupler, and auxiliary and main output ports;
   an adjustable amplitude-and-phase modulator for equalizing the sample of the device input signal and its replica in the sample of the device output, the modulator connected to the main output port of the third coupler and having a control input;
   a summer for subtractively combining the equalized sample of the device input signal and the extracted sample of the device output signal to produce a distortion products sample, the summer having inputs connected respectively to the output of the amplitude-and-phase modulator and to the auxiliary output port of the second coupler;
   a fourth coupler for extracting a portion of the distortion products sample, the fourth coupler having an input connected to the output of the summer, and an auxiliary output port; and
   a synchronous detector for correlating the sample of the device input signal with the extracted portion of the distortion products sample and adjusting the modulator to minimize the correlation result, the detector having a signal input connected to the auxiliary output port of the fourth coupler, a reference input connected to the auxiliary output port of the third coupler, and an output connected to the control input of the modulator.

3. The feed-forward system recited in claim 1 wherein the first sampling means includes:
   a coupler for extracting a sample of the device output, the coupler having an input port adapted to be connected to the device output, and an auxiliary output port; and
   a notch filter having notches at the frequencies of the fundamental component in the device output signal for rejecting the fundamental component in the device output, the notch filter connected to the auxiliary output port of the coupler.

4. The feed-forward system recited in claim 1 wherein the equalizing means includes:
   an adjustable amplitude-and-phase modulator having an input connected to the first sampling means; and
   a subsidiary amplifier connected to the output of the modulator.

5. The feed-forward system recited in claim 1 wherein the second sampling means includes:
   a coupler having an input connected to the combining means, and an auxiliary output port.

6. The feed-forward system recited in claim 1 wherein the proportion-changing means includes:
   a first coupler for extracting a sample of the device input, the first coupler having a main output port adapted to be connected to the device input, and an auxiliary output port;
   a second coupler for extracting a sample of the system output, the second coupler having an input port connected to the output of the combining means, and an auxiliary output port;
   a third coupler having an input port connected to the auxiliary output port of the first coupler, and auxiliary and main output ports;

an adjustable amplitude-and-phase modulator for equalizing the sample of the device input signal and its replica in the system output, the modulator connected to the main output port of the third coupler and having a control input;

a summer for subtractively combining the equalized sample of the device input signal and the sample of the system output to produce a distortion-increased sample of the system output, the summer having inputs connected respectively to the output of the amplitude-and-phase modulator and to the auxiliary output port of the second coupler;

a fourth coupler for extracting a portion of the distortion-increased sample of the system output, the fourth coupler having an input connected to the output of the summer, and an auxiliary output port; and a synchronous detector for correlating the device input signal with the extracted portion of the distortion-increased sample and adjusting the modulator to minimize the correlation result, the detector having a signal input connected to the auxiliary output port of the fourth coupler, a reference input connected to the auxiliary output port of the third coupler, and an output connected to the control input of the modulator.

7. The feed-forward system recited in claim 1 wherein the proportion-changing means includes:

a notch filter having notches at the fundamental frequencies of the system output signal for rejecting the fundamental component in the system output, the notch filter connected to the second sampling means.

8. The feed-forward system recited in claim 1 wherein the control means includes:

a synchronous detector having a signal input connected to the first sampling means, a reference input connected to the proportion-changing means, and an output connected to the equalizing means.

9. A method of adaptively reducing the distortion generated by a device such as an amplifier comprising of the steps of:

extracting a sample of the distortion products from the output of the device;

equalizing the sample and the products remaining in the output of the device after extracting the sample;

subtractively combining the equalized sample and the remaining products to produce a distortion-reduced system output;

extracting a sample of the system output;

increasing the proportion of distortion in the extracted sample of the system output; and correlating the distortion-increased sample of the system output with the sample of the distortion products extracted from the output of the device; and minimizing the correlation result.

10. The method recited in claim 9 wherein the proportion-increasing step includes;

rejecting the fundamental component in the system output.

* * * * *